United States Patent [19]
Nagai

[11] Patent Number: 5,825,797
[45] Date of Patent: Oct. 20, 1998

[54] SEMICONDUCTOR LASER DEVICE

[75] Inventor: Yutaka Nagai, Tokyo, Japan

[73] Assignee: Mitsubishi Denki Kabushiki Kaisha, Tokyo, Japan

[21] Appl. No.: 772,671

[22] Filed: Dec. 20, 1996

[30] Foreign Application Priority Data

Apr. 10, 1996 [JP] Japan .................................. 8-088556

[51] Int. Cl.$^6$ .................................................. H01S 3/19
[52] U.S. Cl. .......................................................... 372/46
[58] Field of Search .................................. 372/46, 45, 43

[56] References Cited

U.S. PATENT DOCUMENTS

| | | | |
|---|---|---|---|
| 5,065,403 | 11/1991 | Komazaki .................................. | 372/45 |
| 5,089,437 | 2/1992 | Shima et al. ............................. | 437/129 |
| 5,282,218 | 1/1994 | Okajima et al. ......................... | 372/46 |
| 5,388,116 | 2/1995 | Ohkubo et al. .......................... | 372/45 |
| 5,394,423 | 2/1995 | Kasahara .................................. | 372/45 |
| 5,408,487 | 4/1995 | Uchida et al. ............................ | 372/45 |
| 5,469,457 | 11/1995 | Nagai et al. .............................. | 372/45 |
| 5,499,260 | 3/1996 | Takahashi et al. ....................... | 372/46 |
| 5,559,819 | 9/1996 | Abe et al. .................................. | 372/46 |
| 5,659,565 | 8/1997 | Kitamura .................................. | 372/43 |

OTHER PUBLICATIONS

Arimoto et al., "150 mW Fundamental–Transverse–Mode Operation of 670 nm Window Laser Diode"; IEEE Journal of Quantum Electronics, vol. 29, No. 6, Jun. 1993, pp. 1874–1879.

*Primary Examiner*—Rodney B. Bovernick
*Assistant Examiner*—Ellen E. Kang
*Attorney, Agent, or Firm*—Leydig, Voit & Mayer

[57] ABSTRACT

A semiconductor laser device includes a semiconductor substrate of a first conductivity type; a lower cladding layer of the first conductivity type, an active layer, and a first upper cladding layer of a second conductivity type successively disposed on the semiconductor substrate; a first insulating film disposed on the first upper cladding layer and having a stripe-shaped opening; a ridge-striped second upper cladding layer of the second conductivity type grown in the stripe-shaped opening of the first insulating film; a second insulating film disposed on side surfaces of the stripe-shaped ridge and on the first insulating film, a region of the active layer opposite the ridge-striped second upper cladding layer serving as a laser resonator having opposed laser resonator facets. The portions of the active layer adjacent the opposed facets include window regions, each window region having a higher band gap energy than the active region generating the laser beam. Therefore, since the first upper cladding layer, except the portion beneath the ridge, has an intended thickness, optical confinement in the horizontal direction is not adversely affected. Moreover, since the same astigmatism as that of the conventional semiconductor laser device having no window structure can be obtained in the laser device, the semiconductor laser device can be used effectively for collecting light from optical disks and optical fibers.

7 Claims, 8 Drawing Sheets

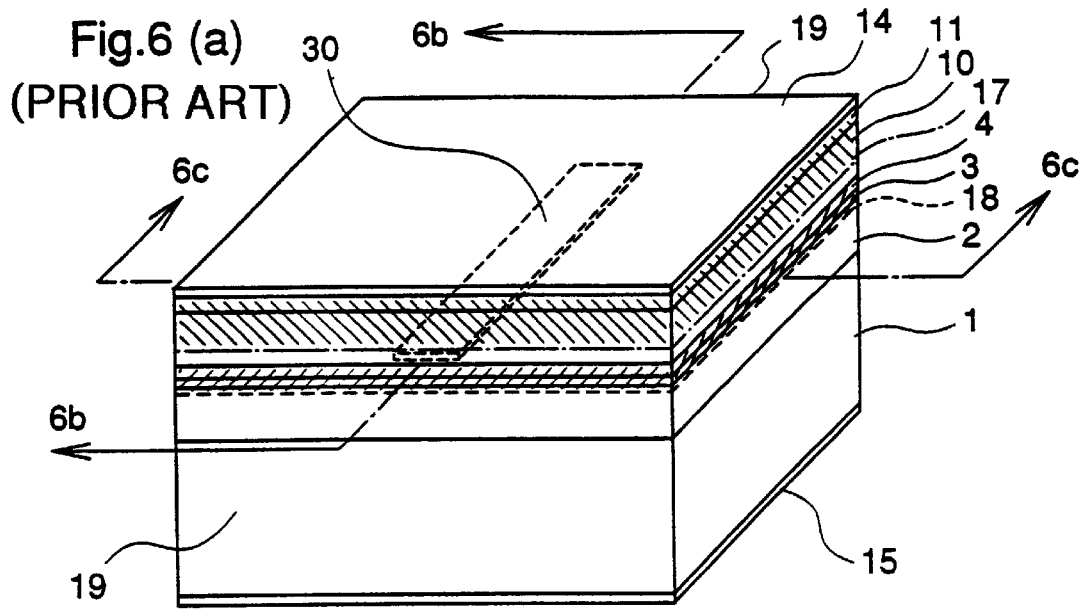
Fig.6 (a) (PRIOR ART)
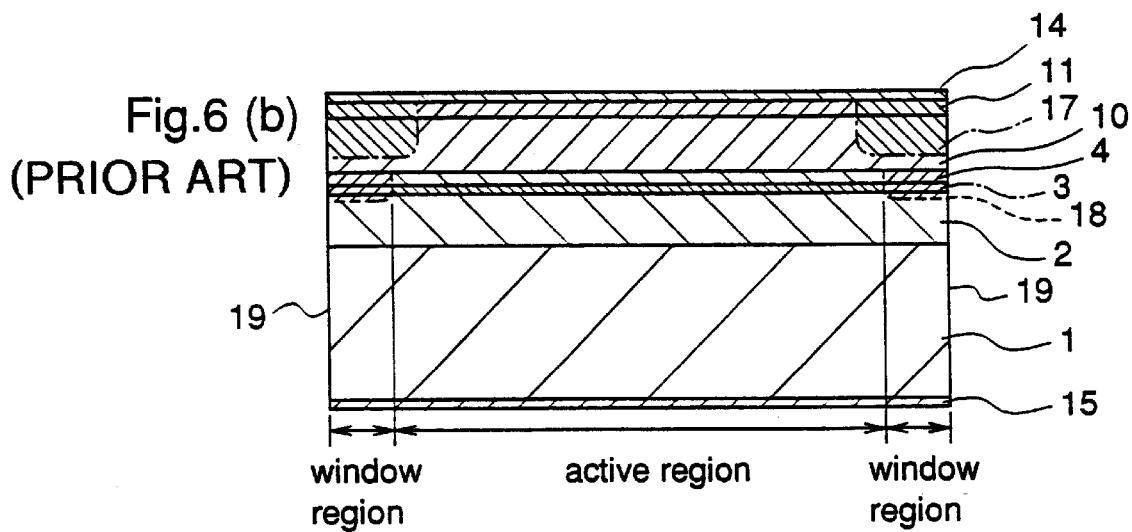
Fig.6 (b) (PRIOR ART)
window region | active region | window region
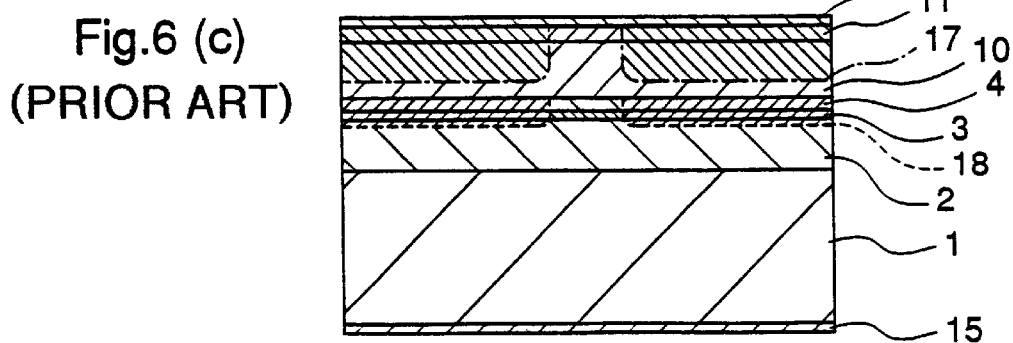
Fig.6 (c) (PRIOR ART)

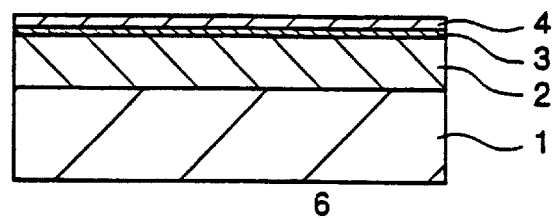
Fig.7 (a) (PRIOR ART)
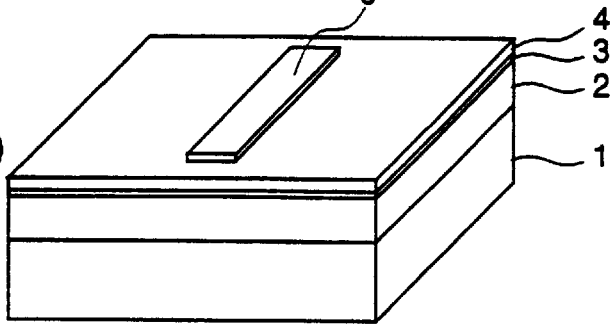
Fig.7 (b) (PRIOR ART)
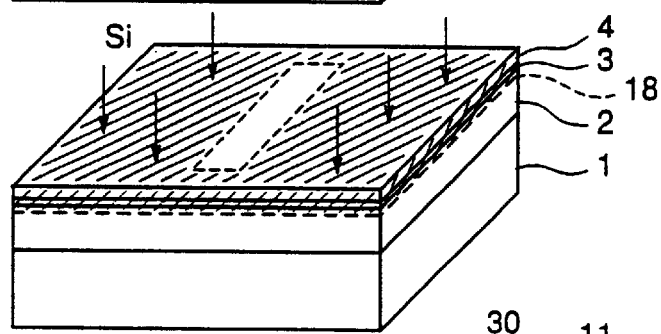
Fig.7 (c) (PRIOR ART)
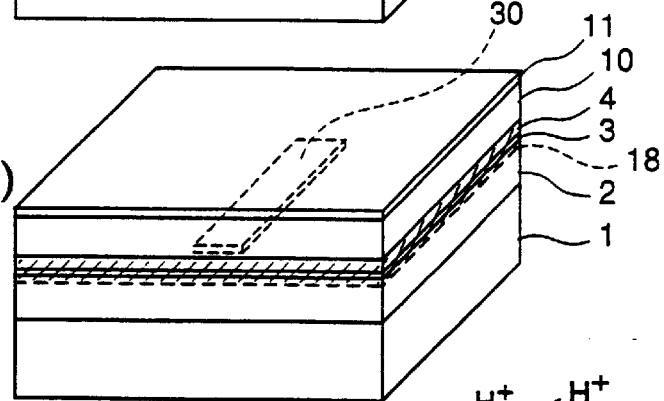
Fig.7 (d) (PRIOR ART)
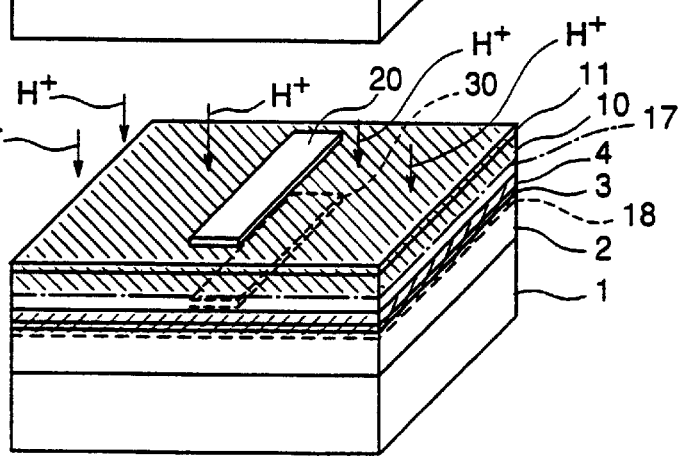
Fig.7 (e) (PRIOR ART)

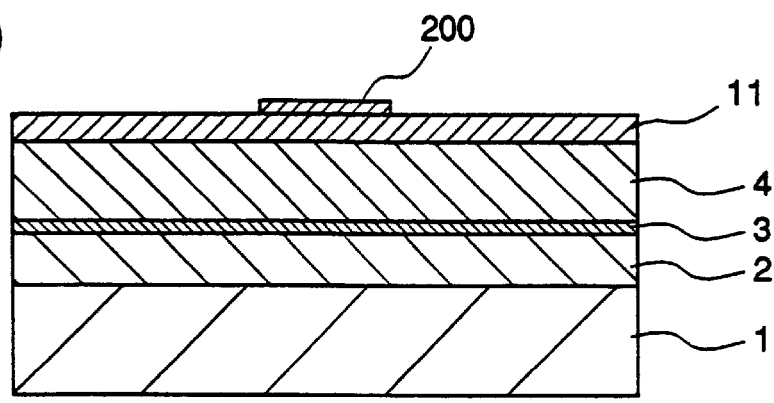
Fig.9 (a) (PRIOR ART)
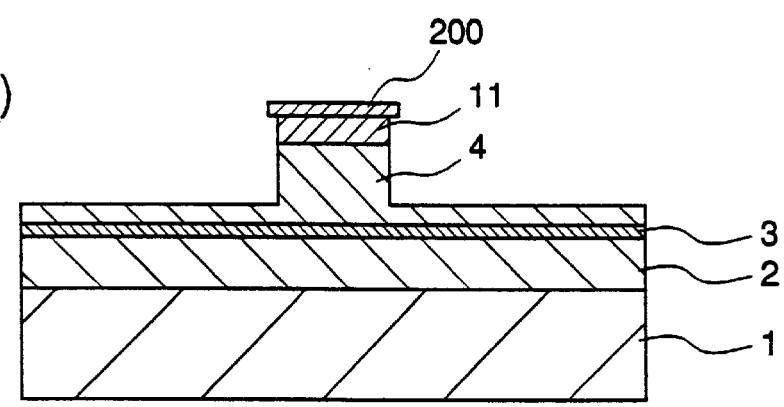
Fig.9 (b) (PRIOR ART)
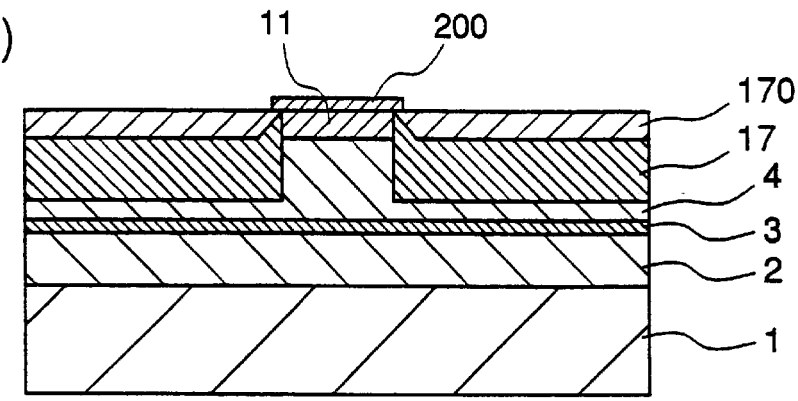
Fig.9 (c) (PRIOR ART)

SEMICONDUCTOR LASER DEVICE

FIELD OF THE INVENTION

The present invention relates to semiconductor laser devices and, more particularly, to a semiconductor laser device comprising window structures at resonator facets and capable of a high power operation. The invention also relates to a method of fabricating the semiconductor laser device.

BACKGROUND OF THE INVENTION

FIGS. 6(a) to 6(c) are diagrams illustrating a structure of a prior art semiconductor laser device. FIG. 6(a) is a perspective view of the semiconductor laser device, FIG. 6(b) is a cross-sectional view taken along a line 6b—6b of FIG. 6(a), i.e., a cross sectional view of the semiconductor laser device taken in a resonator length direction of the semiconductor laser device. FIG. 6(c) is a cross-sectional view taken along a line 6c—6c of FIG. 6(a), i.e., a cross-sectional view of the semiconductor laser device taken in a direction perpendicular to the direction of the resonator length of the semiconductor laser device. In the figures, reference numeral 1 designates an n-type GaAs substrate, numeral 2 designates an n-type $Al_xGa_{1-x}As$ lower cladding layer having a thickness of 1.5~2 μm (x=0.5). Reference numeral 3 designates a quantum well active layer comprising three $Al_yGa_{1-y}As$ (y=0.05~0.15) well layers (not shown) and two $Al_zGa_{1-z}As$ (z=0.2~0.35) barrier layers (not shown), and two optical waveguide layers having the same composition as the barrier layers. In the active layer 3, the about 10 nm thick well layers and the about 10 nm thick barrier layers are successively laminated, and these five layers are sandwiched by the about 35 nm thick optical waveguide layers. Reference numeral 4 designates a p-type $Al_rGa_{1-r}As$ (r=0.5) first upper cladding layer having a thickness of about 0.05~0.5 μm, numeral 10 designates a p-type $Al_rGa_{1-r}As$ (r=0.5) second upper cladding layer, and the total thickness of the first upper cladding layer 4 and the second upper cladding layer 10 is approximately 1.5~2.0 μm. Reference numeral 11 designates a 0.5~1.0 μm thick p-type GaAs contact layer, numeral 17 designates a proton implanted region, numeral 15 designates an n-side electrode, numeral 14 designates a p-side electrode, numeral 18 designates an Si (silicon) diffused region formed by Si ion implantation and annealing. The semiconductor laser device has a 300~600 μm length in a resonator length direction and an about 300 μm width.

Next, a description is given of a method of fabricating this prior art semiconductor laser device. FIGS. 7(a) to 7(e) show a flowchart illustrating a method of fabricating the conventional semiconductor laser device shown in FIGS. 6(a) to 6(c). In the figures, the same reference numerals as those in FIGS. 6(a) to 6(c) designate the same or corresponding parts. Reference numeral 6 designates a stripe-shaped first photoresist, numeral 20 designates a second photoresist, and numeral 30 designates an active region.

The prior art semiconductor laser device is fabricated by the following method. First of all, a lower cladding layer 2, a quantum well layer 3, and a first upper cladding layer 4 are epitaxially grown in this order on an n-type GaAs substrate (wafer) by MOCVD or the like at a growth temperature is 650°~750° C., a V/III ratio of 50~300, and a growth rate of 1 μm/h. A cross-sectional view of the wafer after the growth is shown in FIG. 7(a). Then, as shown in FIG. 7(b), a photoresist is formed over a surface of the first upper cladding layer 4 and patterned to form a stripe-shaped first photoresist 6 which extends in the resonator length direction and does not reach respective positions which later become the opposed facets of the laser resonator. The distance between the photoresist 6 and the position to be the facet of the semiconductor laser resonator is about 20 μm, and the length of the stripe-shaped photoresist 6 in a direction perpendicular to the laser resonator length direction is 1.5~5 μm.

Next, Si ions are implanted using the photoresist 6 as a mask from the front surface of the first cladding layer 4 to a position not reaching the active layer 3. The Si dose required for the Si ion implantation is about $1\times10^{13}\sim1\times10^{15}$ $cm^{-2}$. Since the region beneath the photoresist 6 is masked by the photoresist and ion implantation into the region is prevented, this region does not become an Si ion implanted region. After removal of the photoresist 6, annealing is performed so as to disorder the active layer 3. Disordering of the active layer 3 cannot occur only by ion implantation. When Si atoms are diffused in crystals by annealing, the disordering occurs. The wafer is generally annealed at 700° C. or above under an As pressure ambient. As a result, an Si diffused region 18 is formed as shown in FIG. 7(c) and then a portion of the quantum well active layer 3 within the region 18 is disordered. The regions of the disordered quantum well active layer 3 adjacent the laser resonator facets become window regions which serve as window structures, and the active layer 3, other than the disordered region, becomes an active region.

Next, as shown in FIG. 7(d), a second upper cladding layer 10 and a contact layer 11 are epitaxially regrown in this order on the first upper cladding layer 4, and then a photoresist is formed over the front surface of the contact layer 11. The photoresist is patterned by photolithography to form a stripe-shaped second photoresist 20 having approximately the same size as the first photoresist 6 and extending in the laser resonator length direction. The second photoresist 20 is formed on a region opposite the region where the first photoresist 6 has been formed. Using the photoresist 20 as a mask, protons bombarded the front surface of the contact layer 11 and penetrate to a position not reaching the first upper cladding layer 4. As a result, a proton-implanted region 17 is formed in the contact layer 11 and the second upper cladding layer 10. Since the proton-implanted region 17 has a high resistance, the region serves as a current blocking layer.

Finally, after removal of the photoresist 20, a p-side electrode 14 is produced on the contact layer 11, an n-side electrode 15 is produced on the rear surface of the substrate 1, and the laser resonator facets 19 are formed by cleavage, whereby the semiconductor laser device having window structures as shown in FIGS. 6(a) to 6(c) is obtained.

Next, a description is given of the operation of the prior art semiconductor laser device having window structures as shown in FIGS. 6(a) to 6(c).

When a forward bias voltage is applied across the p-side electrode 14 and the n-side electrode 15, holes are injected to the quantum well active layer 3 through the p-type GaAs contact layer 11, the p-type AlGaAs second upper cladding layer 10, and the p-type AlGaAs first upper cladding layer 4, and electrons are injected to the quantum well active layer 3 through the n-type GaAs semiconductor substrate 1 and the n-type AlGaAs cladding layer 2. The holes and the electrons recombine in the active region of the quantum well active layer 3, resulting in induced emission of light in the quantum well layer. When the quantity of the injected carriers is sufficient to produce light exceeding the loss in the waveguide, laser oscillation occurs. On the other hand, since the proton-implanted region 17 becomes a high resistance region due to the bombardment, no current can flow through the region. In other words, a current flows only through the stripe-shaped region where protons have not been implanted, and laser oscillation occurs in this region.

Next, a description is given of a window structure. The maximum optical output power of an AlGaAs semiconductor laser device generating a laser beam at a wavelength ranging from 0.75~1.0 μm is generally determined by the optical output power at which the resonator facet of the laser is deteriorated. This deterioration of the facet occurs in the following process. In a region adjacent the facet, implanted carriers recombine through surface levels without induced light emission. Due to the recombination, the carriers in the region are reduced and the effective band gap energy decreases, resulting in absorption of the laser beam adjacent the facet. The heat produced by the optical absorption melts the crystals constituting the semiconductor laser device, resulting in loss of a function as a laser resonator. Therefore, in order to realize high optical power operation, a contrivance is required which can increase the optical output power of the laser device without deteriorating the facet. The contrivance is to form a structure which makes absorption of laser beam difficult at the facet region, that is, a window structure which is "transparent" to laser beam. The window structure is obtained by producing a region adjacent a laser resonator facet, and having a higher band gap energy than the active region of the active layer generating laser beam. In the prior art semiconductor laser device shown in FIGS. 6(a) to 6(c), since the active layer 3 comprises a quantum well structure, disordering of the quantum well structure 3 by Si ion implantation and heat treatment such as annealing is performed to form the window structure.

FIGS. 8(a) and 8(b) are Al composition profiles of the regions adjacent the active layer 3 for explaining the disordering. FIG. 8(a) shows an Al composition proportion profile in the quantum well active layer 3 before disordering, FIG. 8(b) shows an Al composition profile in the active layer 3 after the disordering, respectively. In FIGS. 8(a) and 8(b), the same reference numerals as those in FIGS. 6(a) to 6(c) designate the same or corresponding parts. Reference numerals 21, 22, and 23 designate the well layer, cladding layer, and optical waveguide layer of the active layer 3, respectively. In the figures, the abscissa represents Al composition and the ordinate represents the position of the lower cladding layer 2, the active layer 3, and the upper cladding layer 4 in a crystal growth direction. In addition, $Al_2$, $Al_1$, $Al_3$ represent Al compositions of the well layer 21, Al composition of the barrier layer 22 and the optical waveguide layer 23, and Al composition of the active layer 3 after the disordering, respectively. When Si ions are placed in the quantum well active layer 3 by ion implantation and annealing as shown in the FIG. 8(a), the atoms constituting the well layers 21 and the barrier layers 22 are mixed during the diffusion, whereby the region is disordered as shown in FIG. 8(b). As a result, the quantum well active layer 3 after the disordering has the Al composition $Al_3$ which is approximately equal to the Al composition $Al_1$ of the barrier layer 22 and the optical waveguide layer 23, and the effective band gap energy in the active layer 3 is approximately equal to the band gap energy in the barrier layer 22 and the optical waveguide layer 23. Therefore, in the prior art semiconductor laser device shown in FIGS. 6(a) to 6(c), as the effective band gap energy is higher in the disordered region of the quantum well active layer 3 than in the other region of the active layer, the disordered region serves as the window structure "transparent" to the laser beam, whereby the regions of the quantum well active layer 3 adjacent the facets of the laser resonator are regarded as "window" regions.

Due to the effect of the window, the COD level in this semiconductor laser device having window structures is increased over a semiconductor laser device having no window. Therefore, stable high-power operation of 50 mW or above can be realized for a long period of time.

In the prior art semiconductor laser device having window structures, optical confinement in a direction perpendicular to the n-type GaAs substrate 1 at the active region occurs due to a difference in the refractive indices between the quantum well active layer 3, the n-type AlGaAs lower cladding layer 2, and the p-type AlGaAs first upper cladding layer 4. Therefore, in this device, effective optical confinement in the vertical direction is performed throughout the active region between the opposed facets. On the other hand, optical confinement in a direction lateral to the n-type GaAs substrate 1 at the active region is carried out because the proton-implanted region 17 of the p-type AlGaAs second upper cladding layer 10 is a high-resistance current blocking layer. However, at the window regions, optical confinement in the horizontal direction can not be effected because the disordered region extends in the horizontal direction in the window regions when the windows are provided there. Therefore, since the laser beam broadens from where the waveguide does not exist due to the diffraction effect, it is emitted from each of the facets in the vertical direction while it broadens at each edge of the window regions adjacent the active region in the horizontal direction. This difference is called an "astigmatism". Due to this astigmatism, there arises a difference between the focal point in the horizontal direction and that in the vertical direction when light is collected by a lens, resulting in difficulty in utilizing this device for focusing light on to optical disks and optical fibers.

FIGS. 9(a) to 9(c) show a method of fabricating another prior art ridge type semiconductor laser device. This ridge type semiconductor laser device is fabricated in the following process. Initially, as shown in FIG. 9(a), a lower cladding layer 2, an active layer 3, an upper cladding layer 4, and a first contact layer 11 are successively grown on a semiconductor substrate 1, and then a stripe-shaped mask 200 comprising $SiO_2$ or the like is formed on the first contact layer 11. Then, as shown in FIG. 9(b), the first contact layer 11 and the upper cladding layer 4 are wet etched to a predetermined depth using the mask 200 to form a ridge. Next, as shown in FIG. 9(c), current blocking layers 17 and 170 are grown to fill spaces which are produced by some portions being removed by wet etching. Finally, after removal of the mask 200, a second contact layer is formed over the surface of the device, and then electrodes are formed on this second contact layer and on the rear surface of the substrate 1, respectively. Thus, the ridge type semiconductor laser device is completed. In this fabrication method, however, since the ridge waveguide is formed by wet etching, it is difficult to form the upper cladding layer, other than the ridge part, to have a desired thickness, i.e., a residual thickness after etching with good reproducibility. Therefore, the layer thickness varies, thereby adversely affecting the optical confinement in the horizontal direction.

SUMMARY OF THE INVENTION

It is an object of the present invention to provide a semiconductor laser device including a window structure providing improved optical confinement in a horizontal direction and having no astigmatism, resulting in a high-power operation.

Another object of the present invention is to provide a method of fabricating the semiconductor laser device.

Other objects and advantages or the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser device comprises a semiconductor substrate of a first conductivity type having a surface; a lower cladding layer of a first conductivity type, an active layer generating a laser light, a first upper cladding layer of a second conductivity type successively disposed on a semiconductor substrate of the first conductivity type; a first insulating film disposed on the first upper cladding layer of the second conductivity type and having a stripe-shaped opening; a ridge-striped second upper cladding layer of the second conductivity type selectively grown in the stripe-shaped opening of the first insulating film; a second insulating film disposed on the side faces of the second upper cladding layer of the second conductivity type and the surface of the first insulating film; and a region of the active region corresponding to the ridge-striped second upper cladding layer of the second conductivity type serving as a laser resonator having facts, wherein window regions having a band gap energy higher than the active region are provided in the active layer adjacent parallel facets of the laser resonator. Thus, the first upper cladding layer other than the portion beneath the ridge can be formed to have a thickness as intended and this results in no adverse effect on the optical confinement in the horizontal direction, and an astigmatism equal to that of a conventional semiconductor laser device having no window structures is obtained. Therefore, a semiconductor laser device capable of being effectively used for collecting lights in employing optical fibers and optical disks is realized.

According to a second aspect of the present invention, the above-described semiconductor laser device comprises a surface protective layer of a second conductivity type disposed on the first upper cladding layer of the second conductivity type. Therefore, since the first upper cladding layer of the second conductivity type is hardly oxidized, the second upper cladding layer of the second conductivity type having a crystal of superior quality can be grown on the surface protective layer.

According to a third aspect of the present invention, a method of fabricating a semiconductor laser device comprises: preparing a semiconductor substrate of a first conductivity type having a surface; epitaxially growing a lower cladding layer of the first conductivity type, an active layer, a first upper cladding layer of a second conductivity type on the semiconductor substrate; after the process, forming a first insulating film over the surface of the first upper cladding layer; forming a stripe-shaped photoresist on the surface of the first insulating film; using the photoresist as a mask, implanting impurities from the front surface of the first insulating film to a position not reaching the active layer; after removal of the photoresist, disordering the active layer by annealing to form opposed window regions; after the process, forming a stripe-shaped opening in the insulating film including the window regions; using the first insulating mask having the opening as a selective growth mask, epitaxially growing a second upper cladding layer of the second conductivity type and a contact layer on the first upper cladding layer of the second conductivity type to form a ridge; after the process, forming a second insulating mask over the surface of the wafer; after removal of the portion of the second insulating film on the top of the ridge, producing first and second electrodes on the top of the ridge and on the rear surface of the semiconductor substrate of the first conductivity type, respectively. Therefore, since the ridge is formed by selective growth, the first upper cladding layer having a certain layer thickness equal to the residual thickness can be formed with good reproducibility, an improved optical confinement in the horizontal direction can be realized. Moreover, since the ridge is formed which extends to and covering the opposite window regions, a semiconductor laser device having no astigmatism can be fabricated.

According to a fourth aspect of the present invention, the method of the semiconductor laser device comprises epitaxially growing the lower cladding layer of the first conductivity type, the active layer, the first upper cladding layer on the semiconductor substrate of the first conductivity type and subsequently growing a surface protective layer of the second conductivity type on the first upper cladding layer of the second conductivity type. Therefore, since the first upper cladding layer of the second conductivity type is hardly oxidized, a crystal of superior quality is obtained through the second crystal growth, whereby a semiconductor laser device with stable laser characteristics and improved reliability can be fabricated.

BRIEF DESCRIPTION OF THE DRAWINGS

FIGS. 1(a) and 1(b) are diagrams illustrating a semiconductor laser device in accordance with a first embodiment of the present invention, wherein figure 1(a) is a perspective view and figure 1(b) is a cross-sectional view taken along a line 1b—1b in figure 1(a).

FIGS. 6(a) to 6(c) are diagrams illustrating a prior art semiconductor laser device, wherein FIG. 6(a) is a perspective view, FIG. 6(b) is a cross-sectional view taken along a line 6b–6b, and FIG. 6(c) is a cross-sectional view taken along a line 6c–6c in FIG. 6(a).

FIGS. 7(a) to 7(e) are diagrams illustrating process steps in a method of fabricating the prior art semiconductor laser device shown in FIGS. 6(a) to 6(c).

FIGS. 8(a) and 8(b) are diagrams illustrating Al composition profiles of the quantum well active layer 3 of the prior art semiconductor laser device shown in FIGS. 6(a) to 6(c), wherein FIG. 8(a) shows an Al composition profile of the quantum well active layer before disordering, and FIG. 8(b) shows an Al composition profile of the quantum well active layer after disordering.

FIGS. 9(a) to 9(c) are cross-sectional views illustrating process steps in a method of fabricating another prior art semiconductor laser device.

DETAILED DESCRIPTION OF THE PREFERRED EMBODIMENTS

[Embodiment 1]

Figure 1:
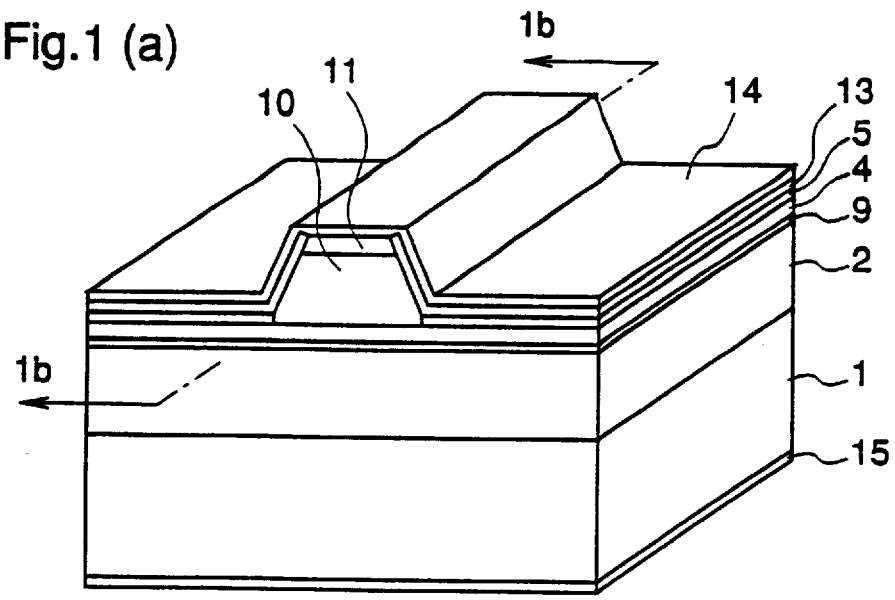
Figure 1:
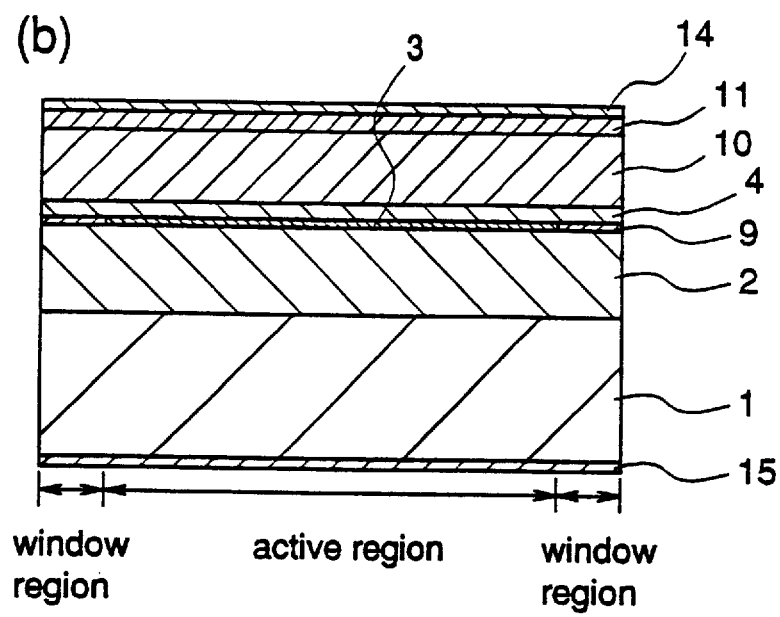

FIGS. 1(a) and 1(b) are diagrams illustrating a semiconductor laser device in accordance with a first embodiment of the present invention, wherein figure 1(a) is a perspective view of a semiconductor laser device in accordance with the first embodiment, and figure 1(b) illustrates a cross section of a ridge taken in a resonator length direction.

A semiconductor laser device in accordance with the first embodiment comprises a structure described below. An n-type $Al_{0.5}Ga_{0.5}As$ lower cladding layer 2 1.5~2 μm thick, a quantum well active layer 3 about 1 μm thick, and a p-type $Al_{0.5}Ga_{0.5}As$ first upper cladding layer 4 0.05~0.5 μm thick are disposed on an n-type GaAs semiconductor substrate 1. Adjacent parallel laser resonator facets of the quantum well active layer 3, window regions 9 disordered by Si ion implantation and annealing are disposed. For the ion implantation, Zn (zinc) ions or other ions may be used in place of Si ions. On the p-type $Al_{0.5}Ga_{0.5}As$ first upper cladding layer 4, a 1.5~2 μm thick p-type $Al_{0.5}Ga_{0.5}As$ second upper cladding layer 10, which is mesa-shaped in cross section, is disposed, and a 0.5~1 μm thick p-type GaAs contact layer 11 is disposed on the second upper cladding layer. The p-type $Al_{0.5}Ga_{0.5}As$ second upper cladding layer 10 forms a ridge, optical waveguide for the light produced in the active layer 3. A first insulating film 5 0.03~0.2 μm thick is disposed on the p-type $Al_{0.5}Ga_{0.5}As$ first upper cladding layer 4 other than a portion beneath the ridge, and a 0.03~0.2 μm thick second insulating film 13 is disposed on the first insulating film 5 and on the side surfaces of the ridge. In addition, a p-type electrode 14 is disposed on the p-type GaAs contact layer 11 and the second insulating film 13, and an n-type electrode 15 is disposed on the rear surface of the substrate 1.

Figure 4:
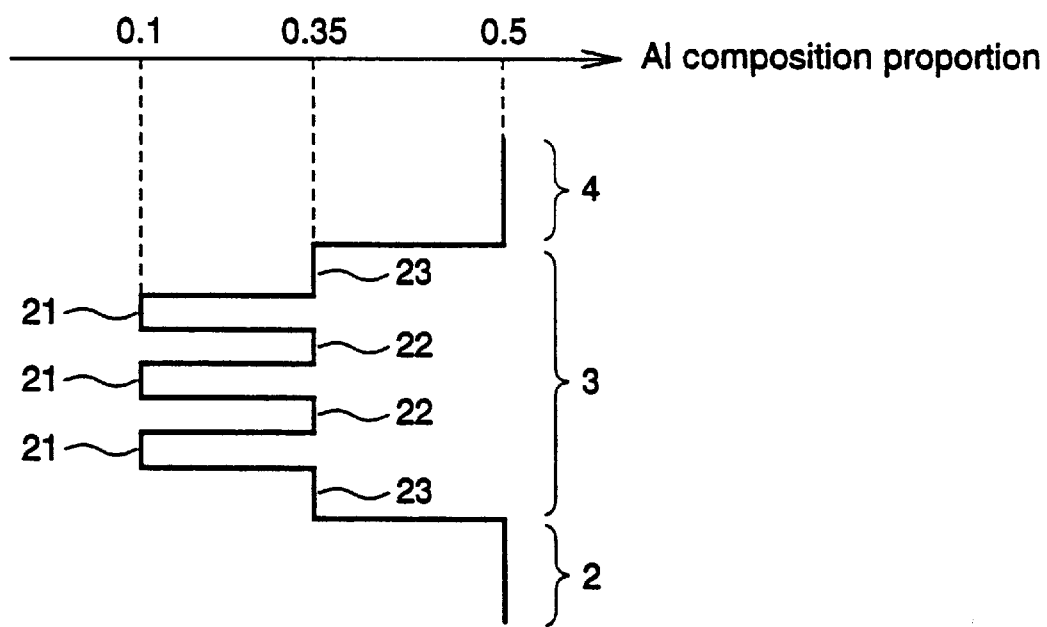
FIG. 4 is a diagram illustrating an Al composition profile of a quantum well active layer of a semiconductor laser device in accordance with the first embodiment of the present invention.
Figure 8:
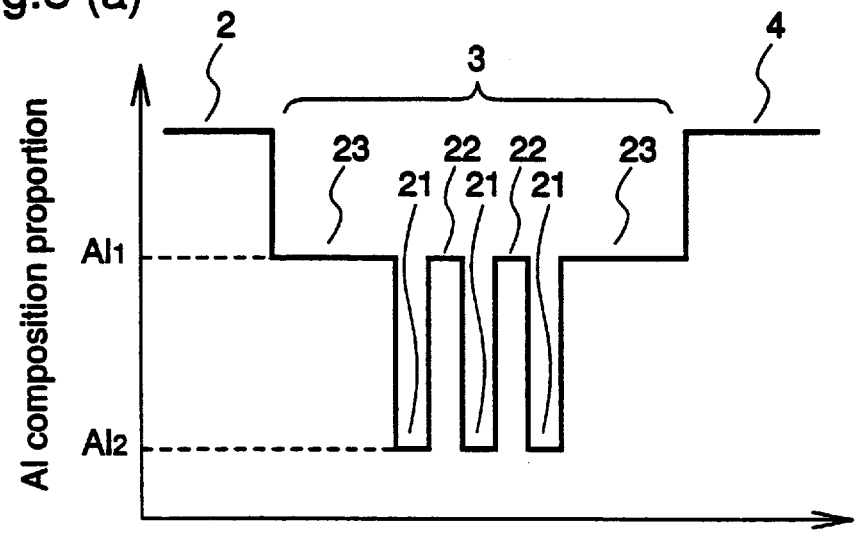
Figure 8:
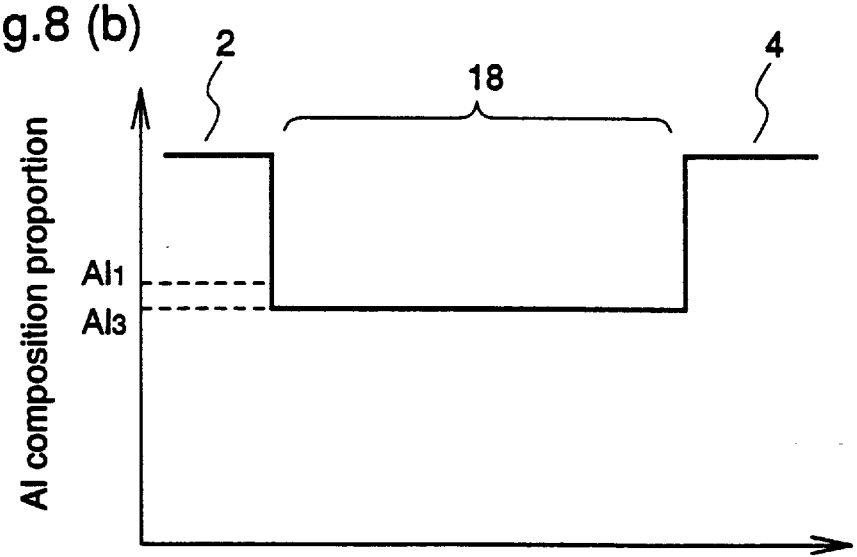

Next, a description is given of a structure of the quantum well active layer 3. FIG. 4 shows an Al composition profile of the active region of the quantum well active layer 3. As shown in the figure, the quantum well active layer 3 comprises three $Al_{0.1}Ga_{0.9}As$ well layers 21 8 nm thick, two $Al_{0.35}Ga_{0.65}As$ barrier layers 22 10 nm thick, and two $Al_{0.35}Ga_{0.65}As$ optical waveguide layers 23 having a thickness of 30 nm and the same composition as that of the barrier layer 22. In the quantum well active layer 3, the well layers 21 and the barrier layers 22 are alternatingly laminated to form a five-layer structure, and the structure is sandwiched by the optical waveguide layers 23, and light of 0.78 μm wavelength is produced. In the window regions of the quantum well active layer 3 adjacent the laser facets, the Al composition of the quantum active layer 3 is approximately equal to the Al composition of the barrier layer 22 and the optical waveguide layer 23 due to the disordering, as shown in FIG. 8(b). Therefore, the effective band gap energy is larger in the disordered window regions than in the active region which is not disordered, so that portions of the quantum well active layer 3 adjacent the laser facets may serve as window structures which are "transparent" to the laser beam produced in the active region.

Next, a description is given of a method of fabricating a semiconductor laser device in accordance with the first embodiment. FIGS. 2(a) to 2(f) show a flow illustrating a method of fabricating the semiconductor laser device in accordance with the first embodiment. The semiconductor laser device of the first embodiment is fabricated in a following process.

Figure 2:
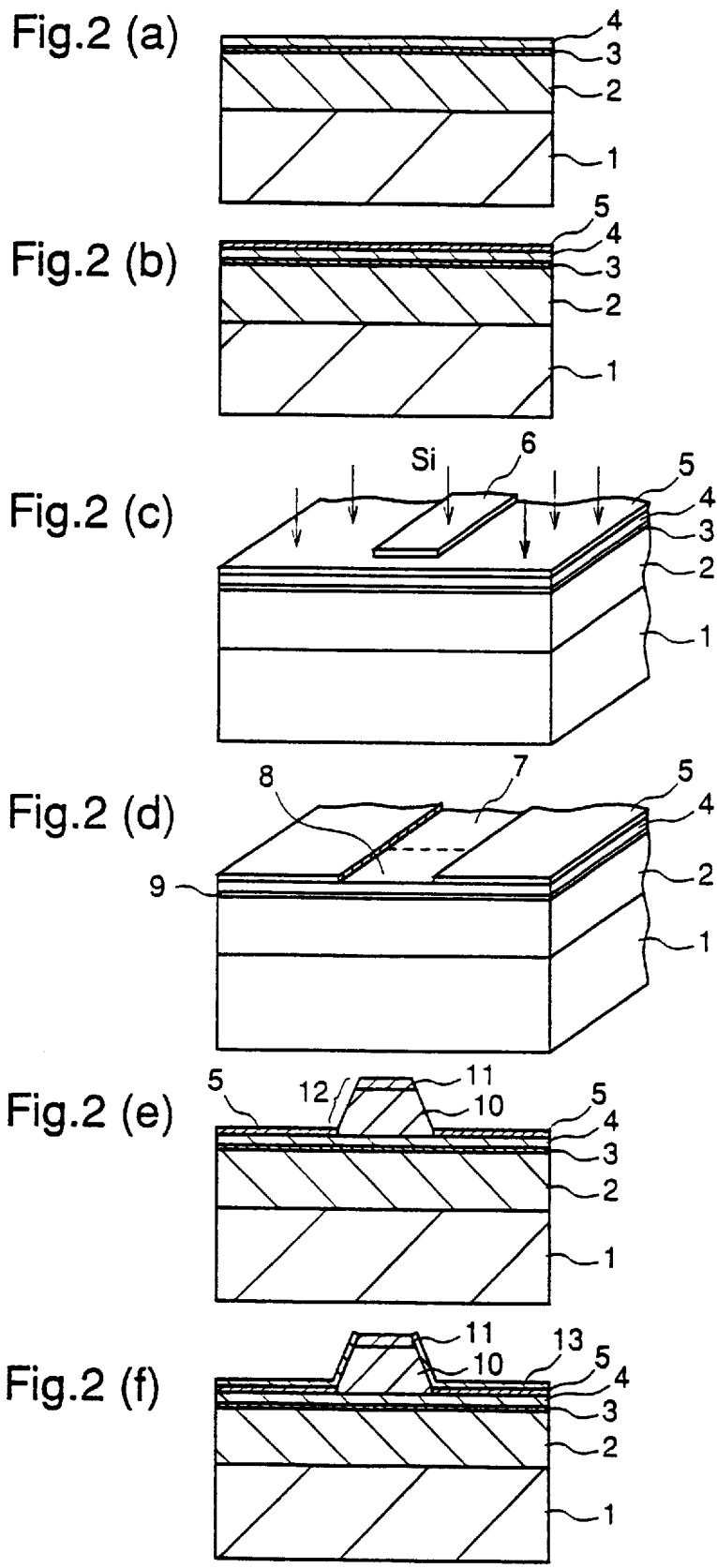
FIGS. 2(a) to 2(f) are diagrams illustrating process steps in a method of fabricating the semiconductor laser device in accordance with the first embodiment of the present invention.

Initially, as shown in FIG. 2(a), the n-type $Al_{0.5}Ga_{0.5}As$ cladding layer 2, the quantum well active layer 3, and the p-type $Al_{0.5}Ga_{0.5}As$ first cladding layer 4 are epitaxially grown on the n-type GaAs semiconductor substrate 1 by MOCVD at a growth temperature is 650°~750° C., a V/III ratio is 50~300, and a growth rate is 1 μm/h.

Next, as shown in FIG. 2(b), the first insulating film 5 is formed on the surface of the wafer after the crystal growth. As a method of forming the film, thermal CVD is generally employed but other methods may be employed as desired.

Then, as shown in FIG. 2(c), a photoresist is formed over the surface of the first insulating film 5 and patterned to form a stripe-shaped photoresist 6 that extends in the laser resonator length direction and does not reach respective positions at which parallel resonator facets are later produced. The distance between the edge of the photoresist 6 and the position to be a resonator facet is about 20 μm, and the length of the stripe-shaped photoresist 6 in a direction perpendicular to the laser resonator length is 1.5~5 μm. The size of the photoresist can be changed as desired.

Next, as shown in FIG. 2(c), Si ions are implanted using the photoresist as a mask from the front surface of the first insulating film 5 to a position not reaching the active layer 3. The Si dose required for the Si ion implantation is about $1 \times 10^{13} \sim 1 \times 10^{15}$ $cm^{-2}$. Since the region beneath the photoresist 6 is masked by this photoresist, ion implantation into the region opposite the photoresist 6 is prevented. Therefore, this region does not become an Si ion implanted region. For the ion implantation, Zn (zinc) ions or other ions may be used in place of Si ions.

After removal of the photoresist 6, annealing is performed to disorder the active layer 3. Disordering of the active layer 3 cannot occur only by the ion implantation but occurs when Si atoms are diffused in the crystal by annealing. The wafer is generally annealed at 700° C. or above under an As pressure ambient.

As a result, the portions of the quantum well active layer 3 in the Si implanted regions are disordered. The disordered portions of the quantum well active layer 3 adjacent to the laser resonator facets become window regions 8, each serving as a window structure described above.

Next, as shown in FIG. 2(d), a perspective view, a stripe-shaped opening 7 is formed in the first insulating film 5. The opening 7, unlike the photoresist, includes the window regions 8.

The p-type $Al_{0.5}Ga_{0.5}As$ second upper cladding layer 10 and the p-type GaAs contact layer 11 are epitaxially regrown in this order using the stripe-shaped first insulating film 5 as a selective growth mask. Here a ridge 12 which is mesa-shaped in cross section is formed in the opening 7 as shown in FIG. 2(e), but no crystal growth occurs on the first insulating film 5.

Then, as shown in FIG. 2(f), after forming the second insulating film 13 over the wafer by thermal CVD, which is also employed in the case of forming the first insulating film 5, the portion of the second insulating mask 13 on the top of the ridge is removed by photolithography and etching, whereby the p-type GaAs contact layer 11 is exposed.

Next, the p-side electrode 14 and the n-side electrode 15 are produced on the surface of the p-type GaAs contact layer 11 and on the rear surface of the n-type GaAs substrate 1, respectively, and then the laser resonator facets are formed by cleavage, whereby the semiconductor laser device having window structures as shown in FIGS. 1(a) and 1(b) is obtained.

A description is given of operation and effects of the semiconductor laser device having window structures in accordance with the first embodiment. Optical confinement at the active region of this semiconductor laser device in a direction perpendicular to the n type GaAs substrate 1 occurs due to the difference in the refractive indices between the quantum well active layer 3 and the n-type AlGaAs lower cladding layer 2, or the p-type AlGaAs first upper cladding layer 4. Therefore, optical confinement in the vertical direction is effectively performed throughout the active region between the opposed facets. On the other hand, as for optical confinement in the horizontal direction at the window regions which has been a problem in the structure of the prior art semiconductor laser device shown in FIGS. 6(a) to 6(c), since the p-type $Al_{0.5}Ga_{0.5}As$ second upper cladding layer 10 as a ridge waveguide extends to and cover the window regions as shown in FIG. 1(b), there is optical confinement in the horizontal direction including in the window regions of the semiconductor laser device of the first embodiment. In other words, there is a difference in the effective refractive indices between the portion of the active layer 3 beneath the ridge and the active layer 3 other than that region. This difference causes a difference in the refractive indices in the horizontal direction, whereby optical confinement in the horizontal direction is realized.

In the semiconductor laser device having such a structure in accordance with the first embodiment of the present invention, since laser beam broadens from the laser facet in the horizontal and vertical directions, it is possible to obtain an astigmatism approximately equal to that of a conventional semiconductor laser device having no window structure. Therefore, a semiconductor laser device capable of being used effectively with optical disks and optical fibers can be realized.

On the other hand, as for the prior art semiconductor laser device having a ridge waveguide as shown in FIGS. 9(a) to 9(c), the ridge waveguide is formed by wet etching. Therefore, it is difficult to form a p-type $Al_{0.5}Ga_{0.5}As$ first upper cladding layer 4, other than the ridge part, having the residual thickness with good reproducibility. However, as shown in the method of fabricating a laser device according to the first embodiment (FIGS. 2(a) to 2(f)), the ridge 12 is formed by selective growth, and therefore the epitaxially grown p-type $Al_{0.5}Ga_{0.5}As$ first upper cladding layer 4, which corresponds to the first upper cladding layer other than the ridge part of the prior art formed by wet etching, can have the same thickness as the residual thickness. Therefore, in the method of fabricating a semiconductor laser device according to the first embodiment, the adjustment of layer thickness is carried out not by wet etching but by crystal growth that enables adjustment of the layer thickness easier than wet etching. A layer thickness which corresponds to the residual thickness in the prior art device can be obtained with good reproductivity and uniformity. As a result, the optical confinement in the horizontal direction can be realized as intended, whereby a semiconductor laser device having superior laser characteristics can be realized.

[Embodiment 2]

Figure 3:
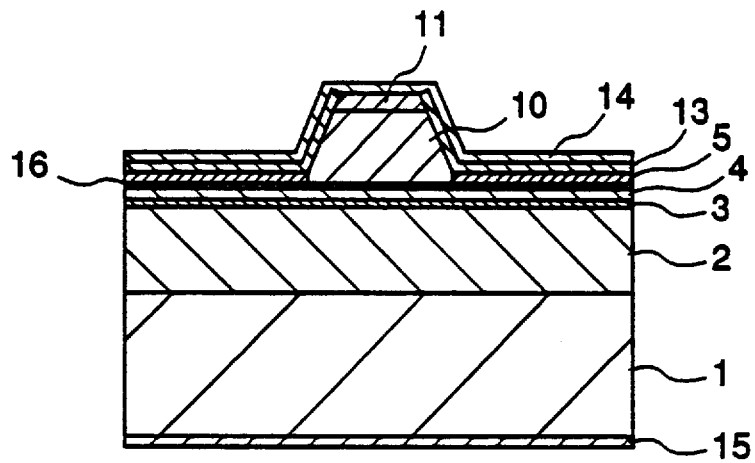
FIG. 3 is a cross-sectional view illustrating a semiconductor device in accordance with a second embodiment of the present invention.

FIG. 3 shows a cross-sectional view of a semiconductor laser device in accordance with a second embodiment of the present invention.

A semiconductor laser device according to the second embodiment comprises a structure in which a surface protective layer 16 is provided on the p-type $Al_{0.5}Ga_{0.5}As$ first cladding layer 4, that is, to the epitaxial structure of the first embodiment the p-type GaAs surface protective layer 16 is added. In the first embodiment, after the first growth, the surface is the p-type $Al_{0.5}Ga_{0.5}As$ first cladding layer 4 and the first cladding layer is prone to be oxidized because it contains Al. In this embodiment, however, since the p-type GaAs surface protective layer 16 is provided on the surface of the $Al_{0.5}Ga_{0.5}As$ first cladding layer 4, the first cladding layer 4 is hardly oxidized and a crystal of superior quality can be obtained at the second crystal growth. Therefore, a semiconductor laser device having stable laser characteristics and excellent reliability can be obtained.

[Embodiment 3]

According to a third embodiment of the present invention, a semiconductor laser device comprises an InGaAs quantum well active layer producing a laser beam of 0.98 μm wavelength, in place of an AlGaAs quantum well active layer 3 used in the first and second embodiments.

Figure 5:
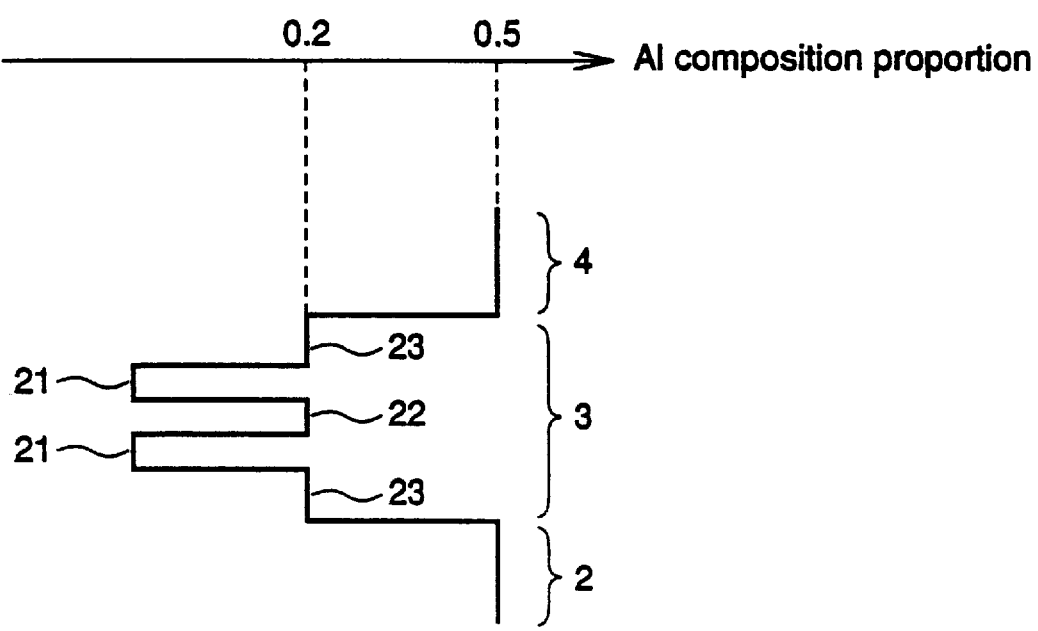
FIG. 5 is a diagram illustrating an Al composition profile of a quantum well active layer of a semiconductor laser device in accordance with a third embodiment of the present invention.

As shown in FIG. 5, the InGaAs quantum well active layer consists of two 8 nm thick well layers 21 comprising InGaAs and an about 20 nm thick barrier layer 22 comprising $Al_{0.2}Ga_{0.8}As$, and two 30 nm thick optical waveguide layers 23 comprising $Al_{0.2}Ga_{0.8}As$. In the active layer, the well layers 21 and the barrier layer 22 are alternatingly laminated to form a three-layer structure and the structure is sandwiched between the optical waveguide layers 23.

In addition, the other part of the structure of the semiconductor laser device according to the third embodiment is identical to those of the first and second embodiments.

The present invention is not limited to the above-described embodiments. For example, the quantum well active layer 3 used in the first to third embodiments can be replaced with other quantum well active layers of various types such as an AlGaInP/GaInP quantum well active layer or the like.

Moreover, alterations can be made when required, for example, replacing an n-type GaAs substrate used in the first to third embodiments with a p-type GaAs substrate, converting the respective layers into opposite conductivity types from those described, or disposing a p-side electrode 14 without forming a p-type GaAs contact layer 11.

What is claimed is:

1. A semiconductor laser device comprising:

a semiconductor substrate of a first conductivity type and having a surface;

a lower cladding layer of the first conductivity type, an active layer, and a planar first upper cladding layer of a second conductivity type successively disposed on the surface of the semiconductor substrate of the first conductivity type;

a first insulating film disposed on and contacting the first upper cladding layer of the second conductivity type and having a stripe-shaped opening;

a ridge-striped second upper cladding layer of the second conductivity type grown on the first upper cladding layer in the stripe-shaped opening of the first insulating film; and a second insulating film disposed on side surfaces of the ridge-striped second upper cladding layer of the second conductivity type and on the first insulating film, a region of the active layer opposite the ridge-striped second upper cladding layer of the second conductivity type serving as a laser resonator having facets, portions of the active layer adjacent the facets including window regions, each window region having a higher band gap energy than a region of the active layer between and remote from the facets.

2. The semiconductor laser device of claim 1 including a planar surface protective layer of a second conductivity type disposed on the planar first upper cladding layer of the second conductivity type and partially sandwiched between the planar first upper cladding layer and the ridge-striped second upper cladding layer.

3. The semiconductor laser device of claim 2 wherein the planar first upper cladding layer is AlGaAs and the planar surface protective layer is a semiconductor material free of aluminum.

4. The semiconductor laser device of claim 3 wherein the planar surface protective layer is GaAs.

5. The semiconductor laser device of claim 1 wherein the second upper cladding layer contacts the planar first upper cladding layer at a regrowth interface.

6. The semiconductor laser device of claim 1 wherein the second insulating film contacts the first insulating film and the side surfaces of the second upper cladding layer.

7. The semiconductor laser device of claim 1 wherein the active layer has a quantum well structure only directly opposite the ridge-striped second upper cladding layer.

* * * * *